(12) United States Patent
Kimura

(10) Patent No.: US 6,628,688 B2
(45) Date of Patent: Sep. 30, 2003

(54) SEMICONDUCTOR LASER DEVICE

(75) Inventor: Takashi Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 29 days.

(21) Appl. No.: 09/897,096

(22) Filed: Jul. 3, 2001

(65) Prior Publication Data

US 2002/0015429 A1 Feb. 7, 2002

(30) Foreign Application Priority Data

Jul. 5, 2000 (JP) .................................... 2000-204054

(51) Int. Cl.[7] .................................................. H01S 5/00
(52) U.S. Cl. ........................................ 372/46; 372/49
(58) Field of Search .................................. 372/46, 49

(56) References Cited

U.S. PATENT DOCUMENTS 4,648,096 A  *  3/1987  Akiba et al. .................. 372/46
5,757,833 A  *  5/1998  Arakawa et al. .............. 372/45

* cited by examiner

Primary Examiner—Quyen Leung
(74) Attorney, Agent, or Firm—Rabin & Berdo, P.C.

(57) ABSTRACT

A semiconductor laser device provided with a lower cladding layer, an active layer and an upper first cladding layer stacked in this order on a compound semiconductor substrate, a ridge-shaped upper second cladding layer provided on the upper first cladding layer, a light confining layer provided on both sides of the upper second cladding layer, and a contact layer provided on the upper second cladding layer. A current non-injection region having no contact layer is provided only on the laser emitting end face side. Although another current non-injection region may be also provided on the reflective end face side, the length of the current non-injection region on the reflective end face side is set to be shorter than that on the laser emitting end face side.

3 Claims, 4 Drawing Sheets

CURRENT NON-INJECTION LENGTH WL
ON LASER EMITTING END FACE SIDE

SEMICONDUCTOR LASER DEVICE

BACKGROUND OF THE INVENTION

1. Field of the Invention

The present invention relates to a structure of a semiconductor laser device used for optical disk apparatus such as a CD-R/RW drive, a DVD-RAM drive and an MD drive, and the like.

2. Description of Related Arts

FIG. 5 is an end face view of a ridge type semiconductor laser device formed of ALGaAs group materials.

On a substrate 1, a lower cladding layer 2 is formed. An active layer 3 is formed on the lower cladding layer 2. An upper first cladding layer 4 is formed thereon. An etching stop layer 5 is formed thereon. Formed on the etching stop layer 5 is a ridge-shaped upper second cladding layer 7, and on both sides thereof, a light confining layer 6 is formed. Further, a contact layer 8 is formed on the upper second cladding layer 7 and the light confining layer 6.

FIG. 4 is a schematic side view showing a shape of a conventional semiconductor laser device. The members shown in FIG. 4 corresponding to those shown in FIG. 5 are assigned the same reference characters with those of FIG. 5. However, in FIG. 4, the illustration of the structure below the upper second cladding layer 7 and the light confining layer 6 is omitted.

The contact layer 8 is not formed on the whole surface of the upper second cladding layer 7 and the light confining layer 6. That is, no contact layer 8 is formed in a certain range in each of regions in the vicinity of a laser emitting end face A and in the vicinity of a reflective end face B, thereby providing current non-injection regions CL, CR which are not excited by current injection. Current non-injection lengths WL, WR, which are the lengths of the current non-injection regions CL, CR along the upper second cladding layer 7 respectively, are substantially equal to each other. When the resonator length L is 500 $\mu$m, both of the current non-injection lengths WL, WR are set about 40 $\mu$m.

FIG. 8 is a schematic sectional view for explaining processes of cutting or singulating a plurality of semiconductor devices each having the abovementioned structure out of a larger semiconductor substrate. The semiconductor laser substrate here means a structure in which layers from a lower cladding layer 2 to a light confining layer 6 and an upper second cladding layer 7 are formed on a substrate 1 and contact layers 8 are formed at predetermined positions thereon. In such a semiconductor laser substrate, a plurality of piece regions D4 (one piece region D4 is shown with oblique lines in FIG. 8) each corresponding to a single semiconductor laser device shown in FIG. 4 are laterally and longitudinally connected with one another in a grid-like arrangement.

By cutting such a semiconductor laser substrate at cutting positions C, a plurality of pieces of semiconductor laser devices each having a sectional shape shown in FIG. 4 can be obtained. The cutting position C is set substantially at the center of the region having no contact layer 8. Consequently, each of cut-out pieces has a side shape in which the current non-injection length WL on the laser emitting end face A side and the current non-injection length WR on the reflective end face B side are substantially equal to each other as shown in FIG. 4.

The current non-injection regions CL, CR are provided in order to prevent heat generation due to occurrence of non-radiative recombination in the end portions of the semiconductor laser device at the time of laser emission. That is, if the contact layer 8 is elongated to both of the end faces A, B and current is injected up to these portions, non-radiative recombination occurs to cause heat generation especially at the laser emitting end face A. Due to the heat generation, the band gap becomes small, and thereby laser light absorption increases, which causes further temperature rise. Repetition of this brings so-called COD (Catastrophic Optical Damage), namely, melting of the end face or faces of the semiconductor laser device, which results in destruction of the semiconductor laser device.

In a semiconductor laser device having a limited resonator length L, by making long the total current non-injection lengths WL+WR, the effect of non-injection increases in correspondence therewith and the COD level becomes high. However, if the total current non-injection lengths WL+WR are excessively long, the effective resonator length Le (see FIG. 4), which is the length of the current injection region, becomes short. Accordingly, the current density becomes large and heat generation in the semiconductor laser device increases, so that the COD level is lowered. As a result, disadvantageously, no high output power laser light can be obtained.

Especially in a small-sized semiconductor laser device, since the resonator length L (see FIG. 4), which is the whole length of the device, is short, the total current non-injection lengths WL+WR cannot be made so long for ensuring a certain effective resonator length Le. This results, disadvantageously, in that the COD level becomes low and no high output power laser light can be obtained.

On the other hand, relating to the two end faces A, B of a semiconductor laser device, heat generation at the time of laser light emission occurs mostly on the laser emitting end face A side, and heat generation on the reflective end face B side is not so serious. Therefore, it can be judged that the current non-injection region CR on the reflective end face B side does not contribute so much to the improvement of the COD level.

SUMMARY OF THE INVENTION

An object of the present invention is to provide a semiconductor laser device in which, by providing a long current non-injection region on the laser emitting end face side, the COD level can be improved and thereby a high output power laser can be obtained.

A semiconductor laser device according to a first aspect of the present invention comprises a lower cladding layer, an active layer and an upper first cladding layer stacked in this order on a compound semiconductor substrate, a ridge-shaped upper second cladding layer provided on the upper first cladding layer, a light confining layer provided on both sides of the upper second cladding layer, and a contact layer provided on the upper second cladding layer, and the device has two end faces thereof with respect to the longitudinal direction of the ridge-shaped upper second cladding layer, namely, a laser emitting end face and a reflective end face, and a current non-injection region having no contact layer is provided only on the laser emitting end face side of the two end face sides.

According to this invention, by omitting a current non-injection region on the reflective end face side, a long current non-injection length can be ensured on the laser emitting end face side without excessively restricting the effective resonator length, namely, the length of the region in which current injection into the active layer is effected.

Thereby, non-radiative recombination at the laser emitting end face can be effectively restricted and at the same time the current density in the device can be controlled to be low. As a result, the COD level can be remarkably improved and a high output power semiconductor laser device can be realized.

Especially in a small-sized semiconductor laser device having a short resonator length (whole length of the device), either of the current non-injection length and the effective resonator length can be also set to be a sufficient length. Consequently, the COD level of the small-sized semiconductor laser device can be improved and a small-sized high output power semiconductor laser device can be realized.

A semiconductor laser device according to a second aspect of the present invention comprises a lower cladding layer, an active layer and an upper first cladding layer stacked in this order on a compound semiconductor substrate, a ridge-shaped upper second cladding layer provided on the upper first cladding layer, a light confining layer provided on both sides of the upper second cladding layer, and a contact layer provided on the upper second cladding layer, and the device has two end faces thereof with respect to the longitudinal direction of the ridge-shaped upper second cladding layer, namely, a laser emitting end face and a reflective end face, and two current non-injection regions each having no contact layer are provided respectively in the vicinity of both of the laser emitting end face and the reflective end face in such a manner that the current non-injection length, which is the length of the current non-injection region along the longitudinal direction of the upper second cladding layer, is longer on the laser emitting end face side than on the reflective end face side.

The effect of the COD level improvement can be obtained without necessarily completely omitting the current non-injection region on the reflective end face side. By making the current non-injection length on the laser emitting end face side longer than that on the reflective end face side, unnecessary current non-injection length on the reflective end face side is reduced. The effective resonator length can be made the longer by a length corresponding to the reduced length of the current non-injection length on the reflective end face side, so that the current density in the region of the effective resonator length can be lowered. Accordingly, in comparison with the case in a conventional structure, heat generation is more restricted and thereby the COD level can be improved. As a result, a high output power semiconductor laser device can be realized. Further, since the COD level of a small-sized semiconductor laser device can be also improved, a small-sized high output power semiconductor laser device can be realized.

It is preferable that the current non-injection length on the laser emitting end face side is equal to or more than two times the current non-injection length on the reflective end face side.

As the current non-injection length on the laser emitting end face side becomes longer with respect to the current non-injection length on the reflective end face side, the abovementioned effect of the COD level improvement becomes higher. When the current non-injection length on the laser emitting end face side is equal to or more than two times the current non-injection length on the reflective end face side, the effect of the COD level improvement becomes apparent in comparison with the COD level of a conventional structure.

The substrate 1 may be a GaAs compound semiconductor substrate and the lower cladding layer may be an $Al_{x1}Ga_{(1-x1)}As$ layer.

The active layer may be a single layer of $Al_{y1}Ga_{(1-y1)}As$, a composite layer formed of $Al_{y11}Ga_{(1-y11)}As$ and $Al_{y12}Ga_{(1-y12)}As$ layers or a composite layer formed of $Al_{y1}Ga_{(1-y1)}As$ and GaAs layers. When the active layer is a MQW (Multi Quantum Well) active layer, it is a composite layer formed of the abovementioned compositions.

The upper first cladding layer may be an $Al_{x2}Ga_{(1-x2)}As$ layer, and the ridge-shaped upper second cladding layer may be an $Al_{x3}Ga_{(1-x3)}As$ layer. The light confining layer may be an $Al_{y2}Ga_{(1-y2)}As$ layer, and the contact layer may be a GaAs layer.

The abovementioned and other objects, features and effects of the present invention will become more apparent from the following description of the embodiments given with reference to the appended drawings.

DESCRIPTION OF THE PREFERRED EMBODIMENTS

Figure 5:
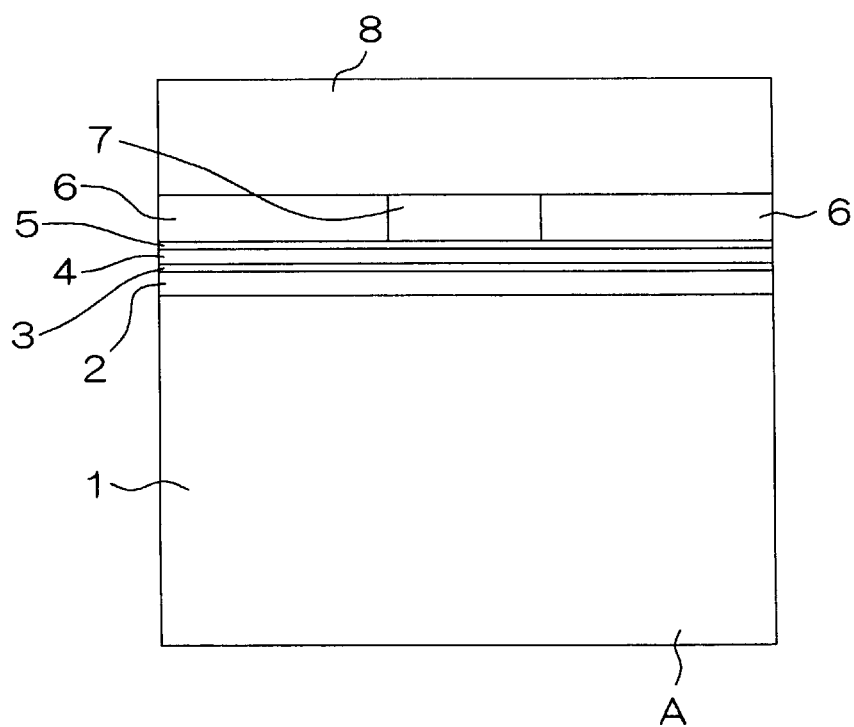
FIG. 5 is a schematic view of a laser emitting end face showing the structure of the general ridge type semiconductor laser device.

An end face structure of a ridge type semiconductor laser device according to a first embodiment of the present invention will now be described with reference to FIG. 5 again. FIG. 5 is used as an end face view for explaining the structure of a laser emitting end face A of a conventional ridge type semiconductor laser device in the abovementioned description, and a semiconductor laser device according to the present invention has also the same structure as shown in FIG. 5 when seen from a laser emitting end face thereof.

A lower cladding layer 2 and an active layer 3 are stacked in this order on a substrate 1. Stacked on the active layer 3 are an upper first cladding layer 4 and an etching stop layer 5 in this order. An upper second cladding layer 7 is formed in the shape of a ridge on the etching stop layer 5. On both sides of the upper second cladding layer 7, a light confining layer 6 is formed. On the upper second cladding layer 7 and the light confining layer 6, a contact layer 8 is formed in ohmic contact with the upper second cladding layer 7.

The substrate 1 is formed of, for example, an n-type GaAs compound semiconductor substrate. In this case, the lower cladding layer 2 may be formed of an n-type $Al_{x1}Ga_{(1-x1)}As$ layer ($0.3<x1<0.7$). The active layer 3 may be of a conductivity type of n-type, P-type or undoped, and formed of an $Al_{y1}Ga_{(1-y1)}As$ layer or a combination of two kinds of layers having different compositions. That is, the active layer 3 may be a MQW (Multi Quantum Well) active layer formed of $Al_{y11}Ga_{(1-y11)}As$ layers and $Al_{y12}Ga_{(1-y12)}As$ layers ($y11 \neq y12$), or a MQW active layer formed of $Al_{y1}Ga_{(1-y1)}As$ layers and GaAs layers.

The upper first cladding layer 4 may be formed of a p-type $Al_{x2}Ga_{(1-x2)}As$ layer. The etching stop layer 5 may be formed of a $Al_zGa_{(1-z)}As$ layer ($0 \leq z < 1.0$) or an $InGa_{(1-Z)}Al_zP$ layer ($0 \leq Z < 0.5$). In either composition case, the conductivity type of the etching stop layer 5 can be p-type or undoped.

Further, the light confining layer 6 can be formed of an $Al_{y2}Ga_{(1-y2)}As$ layer ($0<y2<1.0$), and the ridge-shaped upper second cladding layer 7 can be formed of a p-type $Al_{x3}Ga_{(1-x3)}As$ layer. The contact layer 8 can be formed of a p-type GaAs layer.

The abovementioned semiconductor laser device is an example formed of AlGaAs group semiconductors. However, a semiconductor laser device having similar structure can be also formed of InGaAlP group semiconductors or the like.

Figure 1:
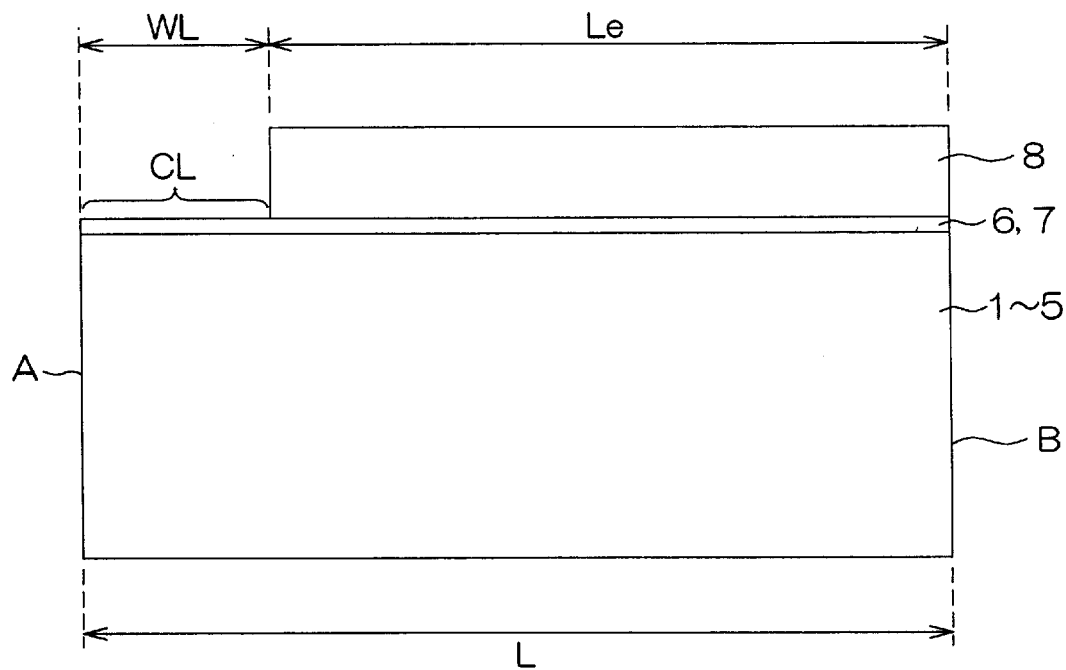
FIG. 1 is a schematic side view of a ridge type of the present invention.

FIG. 1 is a schematic side view showing the structure of a semiconductor laser device according to a first embodiment of the present invention. However, in FIG. 1, illustration of the structure thereof below the upper second cladding layer 7 and the light confining layer 6 is omitted.

This semiconductor laser device has two end faces with respect to the longitudinal direction (right and left direction in FIG. 1) of the ridge shaped upper second cladding layer 7, namely, a laser emitting end face A and a reflective end face B. The reflective end face B has a reflection factor to laser light (reflection factor: 70–95%) higher than the laser emitting end face A has. The contact layer 8 is in ohmic contact with the upper second cladding layer 7 from the reflective end face B throughout the region of the effective resonator length Le. In this region of the effective resonator length Le, excitation occurs by current injection.

The effective resonator length Le is shorter than the resonator length L, which is the whole length of the semiconductor laser device. Therefore, on the laser emitting end face A side, there is a current non-injection region CL in which the contact layer 8 is not in contact with the upper second cladding layer 7. In this current non-injection region CL, excitation by current injection does not occur.

In this embodiment, as apparently shown in FIG. 1, the current non-injection region CL is provided only on the laser emitting end face A side. That is, on the laser emitting end face A side, there is a region in which the contact layer 8 does not exist. However, on the other side, the contact layer 8 is extended to the reflective end face B, and no current non-injection region is provided on the reflective end face B side.

By adopting such a structure, the current non-injection length WL on the side of the laser emitting end face A can be set to be a sufficient length, so that non-radiative recombination in the laser emitting end face A can be effectively restricted. Further, since the effective resonator length Le can be set to be sufficiently long, the current density in the device can be controlled to be low. Consequently, heat generation in the semiconductor laser device can be restricted, so that the COD level can be remarkably improved. As a result, a high output power semiconductor laser device can be realized.

Figure 2:
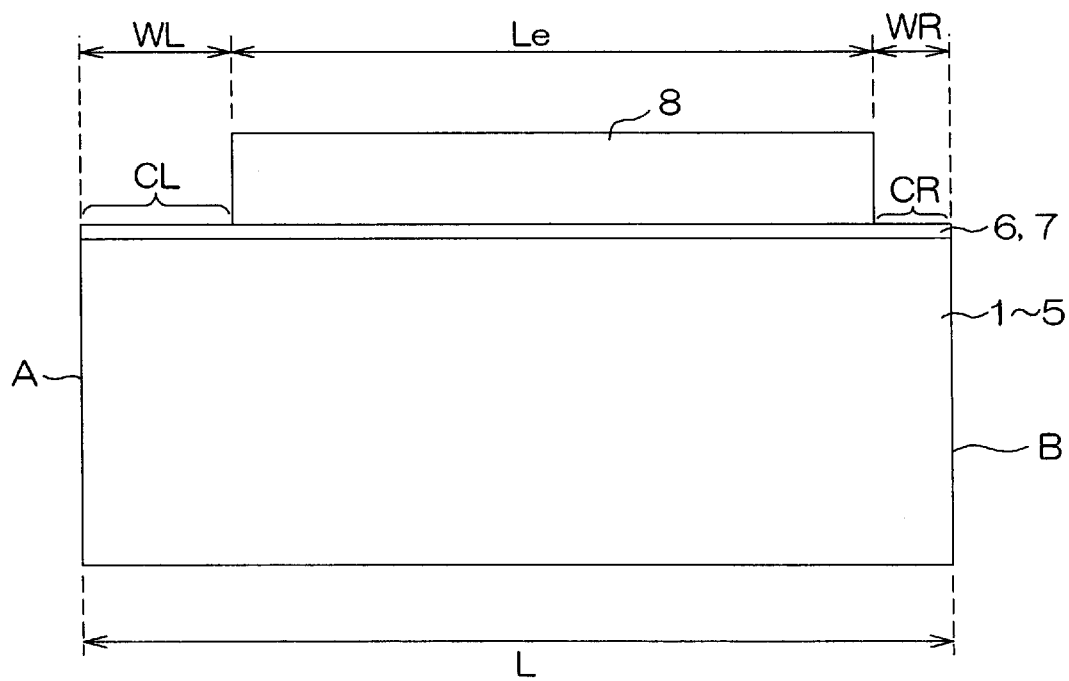
FIG. 2 is a schematic side view of a ridge type semiconductor laser device according to a second embodiment of the present invention.

FIG. 2 is a schematic side view showing the structure of a semiconductor laser device according to a second embodiment of the present invention. The structure from the substrate 1 to the light confining layer 6 and the upper second cladding layer 7 are the same with that of the structure shown in FIG. 1. Therefore, the members shown in FIG. 2 corresponding to those shown in FIG. 1 or 5 are assigned the same reference characters. However, in FIG. 2, the illustration of the structure below the upper second cladding layer 7 and the light confining layer 6 is omitted.

In this embodiment, in the regions in the vicinity of the laser emitting end face A and the reflective end face B, the contact layer 8 is not in contact with the upper second cladding layer 7, and therefore, current non-injection regions CL, CR are provided respectively in the vicinity of both of the end faces A, B. The lengths of these regions CL, CR are shown as current non-injection lengths WL, WR in FIG. 2. Further, excitation by current injection occurs in the region in which the contact layer 8 is in contact with the upper second cladding layer 7, and the length of this region is the effective resonator length Le.

In this embodiment, the current non-injection length WL on the laser emitting end face A side is longer than the current non-injection length WR on the reflective end face B side. In more concrete, for example, a formula WL=2.2×WR is satisfied, and the current non-injection length WL on the laser emitting end face A side is more than two times the current non-injection length WR on the reflective end face B side.

With such a structure, similarly, non-radiative recombination on the laser emitting end face A side can be effectively restrained and at the same time the effective resonator length Le is not excessively restricted. As a result, the COD level can be remarkably improved and a high output power semiconductor laser device can be realized.

Figure 3:
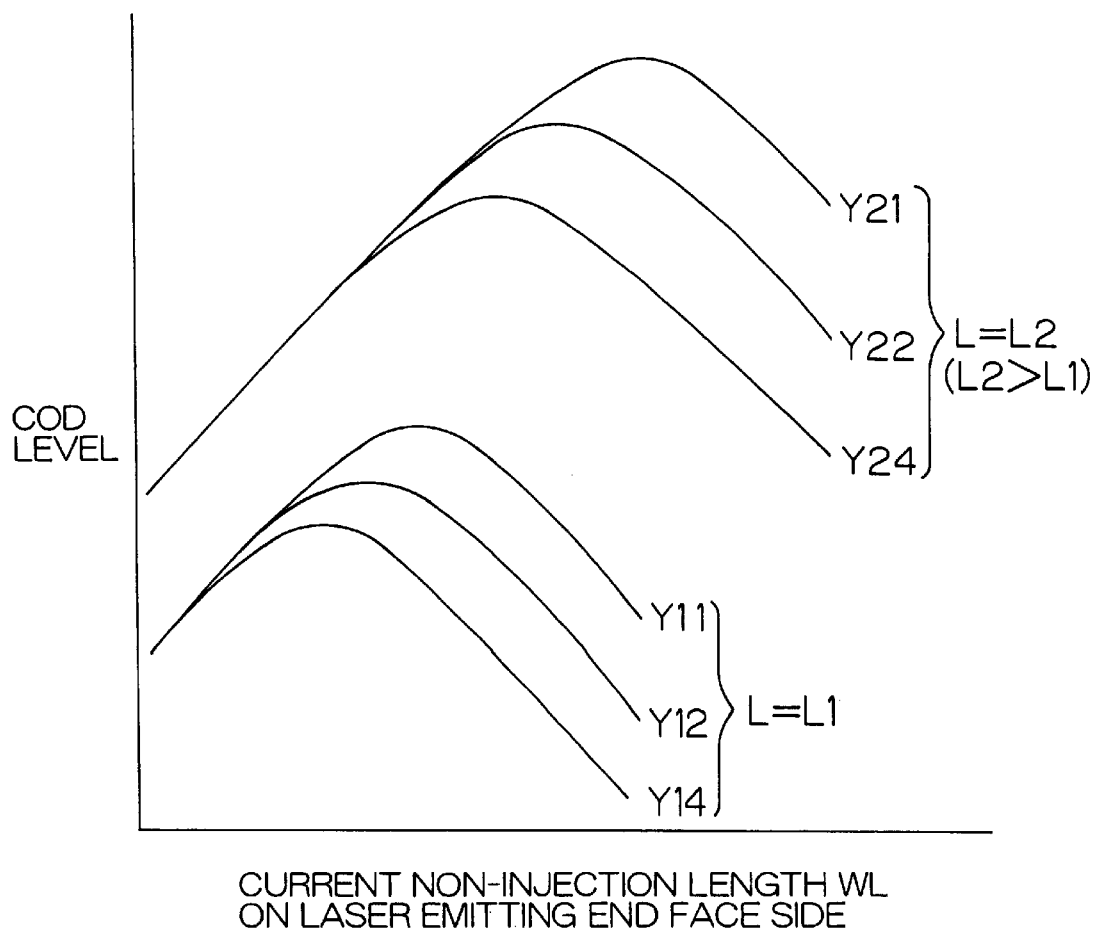
FIG. 3 is a characteristic view showing the relation between the current non-injection length on the laser emitting end face side and the COD level.
Figure 4:
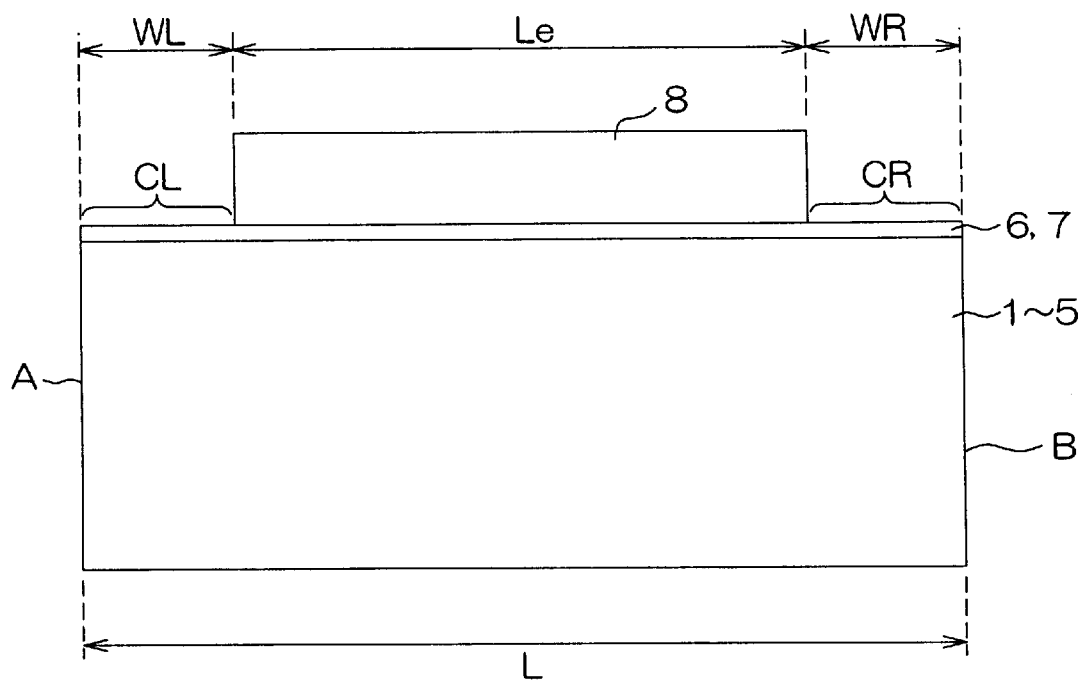
FIG. 4 is a schematic side view of a general ridge type semiconductor laser device.

FIG. 3 is a characteristic view showing the relation between the current non-injection length WL on the laser emitting end face A side and the COD level. Curves Y11, Y12 and Y14 show the results of the cases in which the resonator length L is L1, and curves Y21, Y22 and Y24 show the results of the cases in which the resonator length L is L2 (L2>L1). The curves Y11 and Y21 show the characteristics of the cases of the first embodiment of the present invention and the curves Y12 and Y22 show the characteristics of the cases of the second embodiment of the present invention, while the curves Y14 and Y24 show the characteristics of the cases of a conventional art.

In either of the abovementioned cases, the COD level takes the maximum value when the current non-injection length WL on the laser emitting end face A side is a certain value. This means that, as the current non-injection length WL becomes longer up to a certain value, an effect of restraining heat generation due to non-radiative recombination caused in the vicinity of laser emitting end face A, which remarkably hinders the COD level improvement, is maintained and thereby improving the COD level. On the other hand, when the current non-injection length WL is above the certain value, the effective resonator length Le becomes short, so that the current density in the current injection region becomes high to cause heat generation, and therefore the COD level is lowered.

Further, since the current density within the semiconductor laser device depends upon the resonator length L, the optimized COD level of the semiconductor laser device with resonator length L1 is lower than the optimized COD level of the semiconductor laser device with resonator length L2 (L2>L1).

When the resonator lengths L are the same, for example, L=L1, with respect to the same current non-injection length WL, the semiconductor laser device of the present invention (curve Y12, curve Y11) shows a COD level higher than that the semiconductor laser device of the conventional art (curve Y14) shows.

Further, when the current non-injection length WL on the laser emitting end face A side is optimized, the COD level of the semiconductor laser device of the present invention (curve Y12, curve Y11) is higher than that of the semiconductor laser device of the conventional art (curve Y14). That is, with respect to a semiconductor laser device having the same current non-injection length WL, a higher COD level can be obtained according to the present invention in comparison with that of the conventional art. As a result, a small-sized and high output power semiconductor laser device can be realized according to the present invention.

The order of height of the maximum COD level values is equal to the order of magnitude of the ratios between the current non-injection length WL on the laser emitting end face A side and the current non-injection length WR on the reflective end face B side. In other words, as the ratio between the current non-injection length WL on the laser emitting end face A side and the current non-injection length WR on the reflective end face B side becomes larger, the COD level at the time of the non-injection length WL being optimized becomes higher, and a high output power semiconductor laser device can be obtained. In the case of WL/WR≧2, such an effect becomes apparent.

Figure 6:
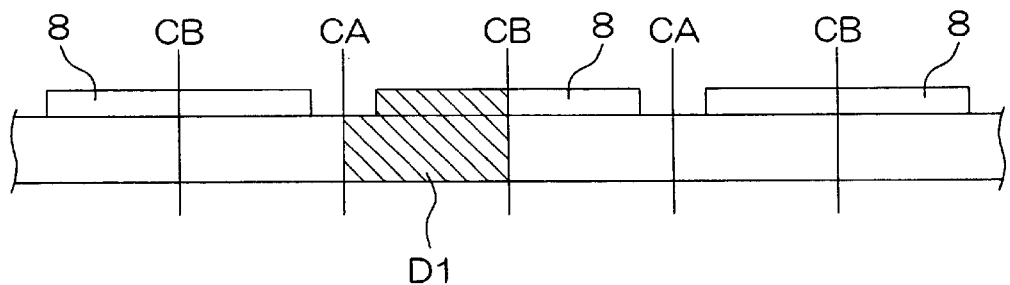
FIG. 6 is a schematic sectional view showing an original semiconductor substrate used for fabricating in a lump a plurality of semiconductor laser devices each having the structure of the first embodiment of the present invention.

FIG. 6 is a schematic sectional view showing an original semiconductor substrate used for fabricating in a lump a plurality of semiconductor laser devices each having the structure of the first embodiment of the present invention. The semiconductor laser substrate here means a structure in which layers from a lower cladding layer 2 to a light confining layer 6 and an upper second cladding layer 7 are formed on a substrate 1 as shown in FIG. 5 and contact layers 8 are formed at predetermined positions thereon as shown in FIG. 5. In such a semiconductor laser substrate, a plurality of piece regions D1 (one piece region D1 is shown with oblique lines in FIG. 6) each corresponding to a single semiconductor laser device shown in FIG. 1 are arranged in close contact with one another in the lateral direction. A plurality of units of sectional structure shown in FIG. 5 may also be arranged in close contact with one another in the direction perpendicular to the drawing paper surface.

By cutting such a semiconductor laser substrate at cutting positions CA, CB, a plurality of pieces of semiconductor laser devices each having a sectional shape shown in FIG. 1 can be obtained. The cutting position CA is set at the center of the region having no contact layer 8, while the cutting position CB is set at the center of the region having the contact layer 8. The cutting planes obtained at the cutting positions CA become the laser emitting end faces A and the cutting planes obtained at the cutting positions CB become the reflective end faces B. That is, each piece of a semiconductor laser device has no current non-injection region CR on the side of the end face corresponding to the cutting plane obtained at the cutting position CB, and has a current non-injection region CL only on the side of the end face corresponding to the cutting plane obtained at the cutting position CA.

Figure 7:
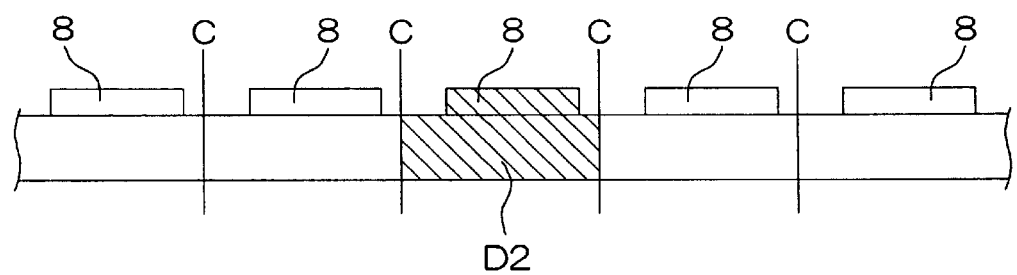
FIG. 7 is a schematic sectional view showing an original semiconductor substrate used for fabricating in a lump a plurality of semiconductor laser devices each having the structure of the second embodiment of the present invention.
Figure 8:
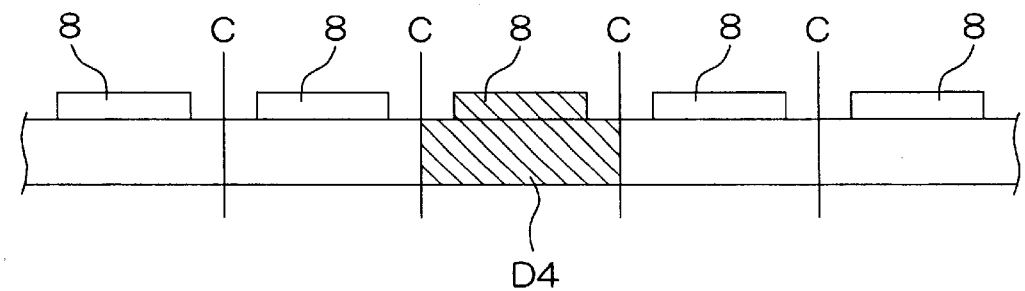
FIG. 8 is a schematic sectional view showing an original semiconductor substrate used for fabricating in a lump a plurality of semiconductor laser devices each a lump a plurality of semiconductor laser devices each having the conventional structure.

FIG. 7 is a schematic sectional view showing an original semiconductor substrate used for fabricating in a lump a plurality of semiconductor laser devices each having the structure of the second embodiment of the present invention. The semiconductor laser substrate here means a structure in which layers from a lower cladding layer 2 to a light confining layer 6 and an upper second cladding layer 7 are formed on a substrate 1 and a contact layers 8 are formed at predetermined positions thereon as shown in FIG. 5. In such a semiconductor laser substrate, a plurality of piece regions D2 (one piece region D2 is shown with oblique lines in FIG. 6) each corresponding to a single semiconductor laser device shown in FIG. 2 are arranged in close contact with one another in the lateral direction. A plurality of units of sectional structure shown in FIG. 5 may also be arranged in close contact with one another in the direction perpendicular to the drawing paper surface.

By cutting such a semiconductor laser substrate at cutting positions C, a plurality of pieces of semiconductor laser devices each having a sectional shape shown in FIG. 2 can be obtained. The cutting position C is set at a position shifted from the center of the region having no contact layer 8 toward one side (left side in FIG. 7). Consequently, in FIG. 7, when left side end face of a piece is a laser emitting end face A and the right side end face thereof is a reflective end face B, a semiconductor laser device is obtained in which the current non-injection length WL on the laser emitting end face A side is longer than the current non-injection length WR on the reflective end face B side.

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No. 2000-204054 filed in the Japan Patent Office on Jul. 5, 2000, and the whole disclosures of this Japanese application is incorporated herein by reference.

What is claimed is:

1. A semiconductor laser device, comprising a lower cladding layer, an active layer and an upper first cladding layer stacked in this order on a compound semiconductor substrate, a ridge-shaped upper second cladding layer provided on the upper first cladding layer, a light confining layer provided on both sides of the upper second cladding layer, and a contact layer provided on the upper second cladding layer, wherein the device has a laser emitting end face and a reflective end face at both ends thereof with respect to a longitudinal direction of the ridge-shaped upper second cladding layer, and two current non-injection regions each having no contact layer are provided respectively in the vicinity of both of the laser emitting end face and the reflective end face, and wherein a current non-injection length, which is a length of the current non-injection region along the longitudinal direction of the upper second cladding layer, is longer on the laser emitting end face side than on the reflective end face side.

2. A semiconductor laser device as claimed in claim 1, wherein the current non-injection length on the laser emitting end face side is equal to or more than two times the current non-injection length on the reflective end face side.

3. A semiconductor laser device as claimed in claim 1, wherein the compound semiconductor substrate is a GaAs compound semiconductor substrate;

the lower cladding layer is an $Al_{x1}Ga_{(1-x1)}As$ layer;

the active layer is a single layer of $Al_{y11}Ga_{(1-y11)}As$, a composite layer formed of $Al_{y11}Ga_{(1-y11)}As$ and $Al_{y12}Ga_{(1-y12)}As$ layers, or a composite layer formed of $Al_{y1}Ga_{(1-y1)}As$ and GaAs layers;

the upper first cladding layer is an $Al_{x2}Ga_{(1-x2)}As$ layer;

the ridge-shaped upper second cladding layer is an $Al_{x3}Ga_{(1-x3)}As$ layer;

the light confining layer is an $Al_{y2}Ga_{(1-y2)}As$ layer; and the contact layer is a GaAs layer.

* * * * *